United States Patent
Ohmori et al.

(10) Patent No.: US 7,730,833 B2
(45) Date of Patent: Jun. 8, 2010

(54) METHOD FOR PRODUCING SCREEN PRINT BY SELECTING CLEARANCE BETWEEN SCREEN AND PRINTING MATERIAL

(75) Inventors: Makoto Ohmori, Nagoya (JP); Yukio Aisaka, Nagoya (JP); Ayumi Ida, Nagoya (JP); Tsutomu Nanataki, Toyoake (JP)

(73) Assignee: NGK Insulators, Ltd., Nagoya (JP)

( * ) Notice: Subject to any disclaimer, the term of this patent is extended or adjusted under 35 U.S.C. 154(b) by 289 days.

(21) Appl. No.: 11/970,795

(22) Filed: Jan. 8, 2008

(65) Prior Publication Data

US 2008/0223234 A1    Sep. 18, 2008

(30) Foreign Application Priority Data

Mar. 12, 2007  (JP)  ............... 2007-061968
Oct. 31, 2007  (JP)  ............... 2007-282973

(51) Int. Cl.
- *B41M 1/12* (2006.01)
- *B41F 15/08* (2006.01)
- *B41F 15/36* (2006.01)

(52) U.S. Cl. ............... 101/129; 101/114; 101/127.1
(58) Field of Classification Search ............... 101/127.1, 101/129, 114
See application file for complete search history.

(56) References Cited

U.S. PATENT DOCUMENTS

2008/0098911 A1 * 5/2008 Yanagihara et al. ...... 101/127.1

FOREIGN PATENT DOCUMENTS

| JP | 09-136394 A1 | 5/1997 |
| JP | 11-034288 A1 | 2/1999 |
| JP | 2000-318120 A1 | 11/2000 |
| JP | 2006-062241 A1 | 3/2006 |

* cited by examiner

*Primary Examiner*—Leslie J Evanisko
(74) *Attorney, Agent, or Firm*—Burr & Brown

(57) ABSTRACT

A method for producing a screen print having a given print pattern formed on a printing material by sliding a squeegee over a screen of a screen printing plate that includes the screen being disposed above the printing material in the form of a printing plate frame while keeping a given clearance therebetween. As such, the ratio ($L_P/L_F$) of a length ($L_P$) of a side of the printing pattern perpendicular to the axis of the sliding direction of the squeegee to an internal size ($L_F$) of a side of the printing plate frame perpendicular to the axis of the sliding direction of the squeegee is 0.45 or more, and an optimum clearance between the printing material and the screen printing plate is then selected and set on the basis of the correlation between the clearance and the degree of deviation in printing position of the print pattern.

12 Claims, 8 Drawing Sheets

METHOD FOR PRODUCING SCREEN PRINT BY SELECTING CLEARANCE BETWEEN SCREEN AND PRINTING MATERIAL

TECHNICAL FIELD

The present invention relates to a method for producing a screen print that is excellent in printing precision.

BACKGROUND ART

Screen printing which forms a print film comprising ink, paste or the like on the surface of a material to be printed using a printing plate for screen printing (hereinafter sometimes referred to as merely "screen printing plate" or "printing plate") can form fine patterns and has high mass-productivity, and hence is utilized in a wide variety of industrial fields. In general, screen printing is a method which uses a screen mask constructed by stretching onto a printing plate frame a mesh having openings closed with a resin (such as photosensitive emulsion film), an ink material is then placed on the upper face of the screen mask and a squeegee is slid, thereby squeezing out the ink material to the under side of the screen mask (substrate side) through the given openings formed in the screen mask to perform the printing.

According to this screen printing method, since the screen mask is flexible and besides the printing pressure is low, it is possible to carry out the printing on various printing materials, such as papers, fabrics, plastics, glasses, metals, and ceramics. Furthermore, since patterns formed by ink materials can be made thick, the screen printing can also be applied to production of electronic parts such as thick film IC (hybrid IC), printed-wiring boards, resistors and capacitors. The screen mask is produced by patterning a photosensitive emulsion film coated on a mesh by photolithographic technology. It is also produced by forming mesh patterns by selectively etching a metallic film by photolithographic technology.

General screen printing plates used for screen printing have a film-like screen having a support member comprising a gauze and a mask material having openings of a given shape and placed on the support member and a printing plate frame on which the screen is stretched. In printing, first the screen of the screen printing plate is placed on the surface (the surface to be subjected to printing) of a suitable printing material, and ink or paste is applied to the screen. Then, a squeegee or the like is slid across the screen to squeeze out the paste or the like from the openings, whereby print patterns corresponding to the shape of openings or the arranged patterns when a plurality of openings are formed on the surface of the printing material.

For example, in the field of electronic part production, the above screen printing method may be employed from the points of both precision and mass-productivity. In this field, the demand for forming finer print patterns with high precision has steadily increased due to the recent development of technology to miniaturize the size of the parts.

However, a printing plate frame may have some distortion, and hence it is difficult to make a completely flat screen stretched on the printing plate frame. Moreover, since the distortion of the printing plate frame differs depending on the printing plate frame, the arranged patterns of the openings on the screen stretched on the printing plate frame also delicately differ depending on the respective screen printing plates. Therefore, there is a problem that when the screen printing is carried out using a plurality of screen printing plates in the arranged patterns of the openings, the print patterns on the respective resulting screen prints may delicately differ from each other.

Recently, substrates which are to be printed tend to become larger, and hence the screen (screen printing plate) used for printing on large-sized substrates similarly tends to be large-sized. Therefore, due to the increase of the size of the substrates or the screen printing plate, the difference in print patterns of the respective resulting screen prints has further become evident.

The degree of difference in opening patterns of respective screen printing plates is not particularly significant as long as it is within a specific tolerance permissible for the respective prints obtained by the printing. However, with recent progress in miniaturation technology, the screen printing precision must further be improved. Particularly, in the case of making laminated electronic parts by laminating screen prints, a slight deviation of printing position between the screen prints will result in more conspicuous deviation caused by lamination of the screen prints. Therefore, in order to make laminated electronic parts with higher screen print performance, it is important that the degree of deviation in the printing position of the screen prints remains within a permissible specific tolerance range.

As relevant prior art, there are disclosed a printing plate for screen printing in which the crossing portion of wire (gauze) constituting the support member of screen is fastened (Patent Document 1), a printing plate for screen printing in which linear expansion coefficient of printing plate frame is specified (Patent Document 2), a method of screen printing in the state of a given side of a printing plate frame being curved in a convex form (Patent Document 3), and a printing plate for screen printing provided with a printing plate frame deformable in both the outer and inner directions, as well as a method for producing prints using the same (Patent Document 4). However, even these printing plates for screen printing or printing methods using them cannot sufficiently meet the high printing precision demands that need to be assured and the degree of deviation in the printing position that needs to be maintained within a permissible range so that further printing improvement is achieved.

Patent Document 1: JP-A-9-136394
Patent Document 2: JP-A-11-34288
Patent Document 3: JP-A-2000-318120
Patent Document 4: JP-A-2006-62241

SUMMARY OF INVENTION

Problem to be Solved by the Invention

The present invention has been made in an attempt to solve the above problems, and the object is to provide a method for producing a screen print according to which the screen printing is excellent in precision and can be performed even when the material to be subjected to printing (printing material) is large and has a large printing area, with the resulting screen print being excellent in printing precision.

As a result of intensive research conducted by the inventors, it has been found that the above object can be attained by selecting and setting an optimum clearance between the printing material and the screen on the basis of the correlation of the clearance between the printing material and the screen while being set with the degree of deviation in printing position of print pattern formed. Thus, the present invention has been accomplished.

That is, the present invention provides the following method for the production of screen prints.

[1] A method for producing a screen print having a given print pattern formed thereon by sliding a squeegee in a given direction over a screen of a screen printing plate comprising the screen having a mask material with openings and a printing plate frame on which the screen is stretched, said screen being disposed above a printing material in the form of a flat plate in parallel to the printing material while keeping a given clearance therebetween, wherein a ratio ($L_P/L_F$) of a length ($L_P$) of a side of the print pattern perpendicular to axis of the sliding direction of the squeegee to an internal size ($L_F$) of a side of the printing plate frame perpendicular to axis of the sliding direction of the squeegee is 0.45 or more, and an optimum clearance between the printing material and the screen is selected and set on the basis of correlation between the clearance in the range of 0.1-2 mm and the degree of deviation in printing position of the print pattern.

[2] A method for producing a screen print as described, wherein the optimum clearance is selected and set preferably by the following steps (1)-(5):

(1) a test printing is carried out with setting the clearance at values of an optional two or more points in the range of 0.1-2 mm to obtain an initial trial print, (2) the degree of deviation in printing position of the initial trial print is measured, and a calibration curve is obtained by plotting the degree of deviation in printing position against the clearance set above, (3) a test printing is carried out with setting the clearance at value of an optional one or more points in the range of 0.1-2 mm to obtain a subsequent trial print, (4) the degree of deviation in printing position of the subsequent trial print is measured, the degree of deviation in printing position is plotted against the clearance set above, and then the calibration curve is offset to obtain a virtual calibration curve which passes the plotted points, and (5) the optimum clearance at which the degree of deviation in printing position of the print pattern is the smallest is then selected and set from the virtual calibration curve.

[3] A method for producing a screen print as described, wherein the optimum clearance is selected and set preferably by the following steps (1a)-(3a):

(1a) a test printing is carried out with setting the clearance at values of an optional two or more points in the range of 0.1-2 mm to obtain a trial print, (2a) the degree of deviation in printing position of the trial print is measured, and a calibration curve is obtained by plotting the measured degree of deviation in printing position against the clearance set above, and (3a) the optimum clearance at which the degree of deviation in printing position of the print pattern is the smallest is then selected and set from the calibration curve.

[4] A method for producing a screen print as described, wherein the clearance is preferably 0.3-1.5 mm.

[5] A method for producing a screen print as described, wherein the printing material is preferably a fired ceramics substrate or a ceramics green sheet.

[6] A method for producing a screen print as described, wherein the printing material is preferably a ceramics green sheet and the screen print is a constituent of a laminated substrate obtained by laminating a plurality of the prints.

ADVANTAGES OF THE INVENTION

According to the method for producing a screen print of the present invention, the screen printing method can be performed even on a large printing material having a large printing area with the screen print producted being excellent in printing precision. Furthermore, according to the method for producing a screen print of the present invention, a screen print in which the degree of deviation in printing position is controlled to a specific range is also produced. Therefore, in the case of using the screen print obtained by the method for producing a screen print of the present invention, even when a plurality of the screen prints are laminated, the total deviation in the printing position (deviation caused by lamination) can be controlled to a small amount within a permissible range and thus laminated electronic parts of higher performance and screen print quality can be provided.

DESCRIPTION OF REFERENCE NUMERALS

1: opening, 2: mask material, 3: screen, 4: printing plate frame, 5: screen printing plate, 6: air cylinder, 10: printing material, 11: printing plate frame holder, 12: printing stage, 30: print pattern, A-H: measuring points, CL: clearance, $L_F$: internal size of printing plate frame, $L_P$: length of one side of print pattern

DETAILED DESCRIPTION OF THE INVENTION

The preferred embodiments of the present invention will be explained below. It will be understood that the present invention is not limited to the embodiments, and various changes and improvements may be made based on the common knowledge of those skilled in the art within the principle and scope of the invention.

Figure 1:
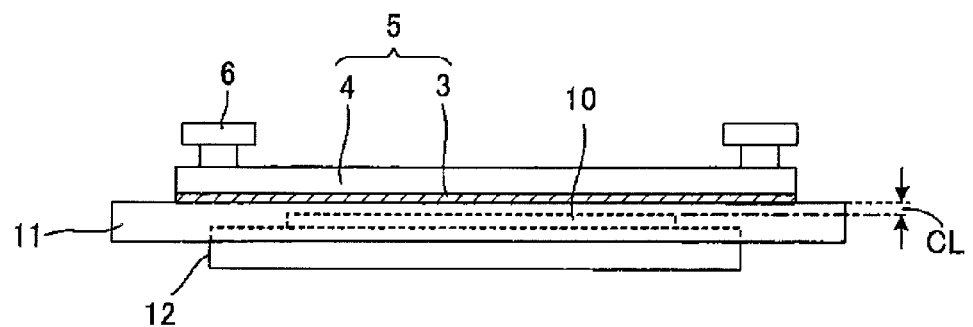
FIG. 1 is a side view of one example of a printing machine used in the method for producing a screen print according to the present invention.
Figure 3:
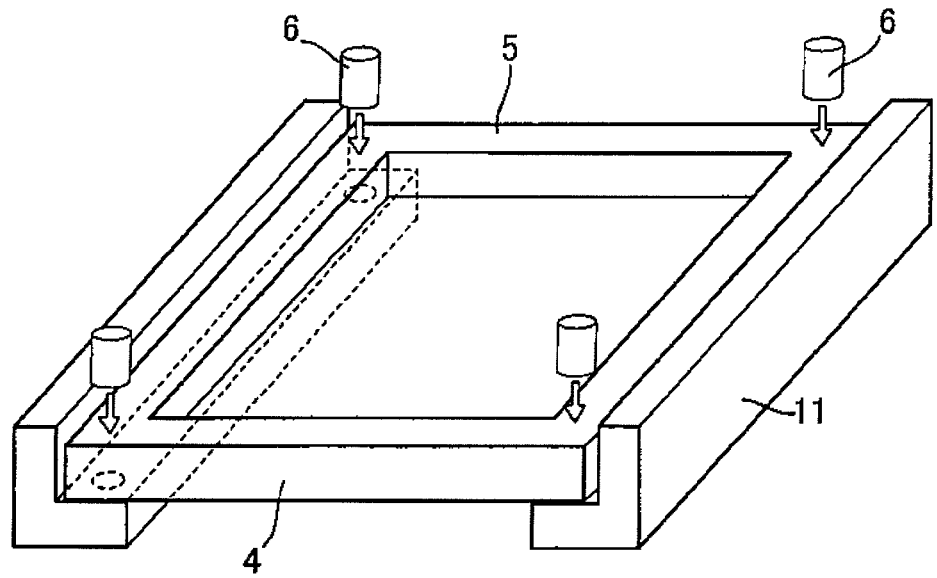
FIG. 3 is an oblique view showing the state of the screen printing plate being disposed on a printing plate frame holder.

FIG. 1 is a side view showing one example of a screen printing plate used in the method for producing a screen print according to the present invention, and FIG. 3 is an oblique view showing the state of the screen printing plate being disposed on a printing plate frame holder. As shown in FIG. 1 and FIG. 3, in one embodiment of the method for producing a screen print according to the present invention, first, the screen printing plate 5 is placed on the printing plate frame holder 11. The screen printing plate 5 comprises a filmy screen 3 and a printing plate frame 4 on which the screen 3 is stretched. Numeral 6 in FIG. 1 shows an air cylinder which fixes the screen printing plate on the printing plate frame holder 11.

Figure 2:
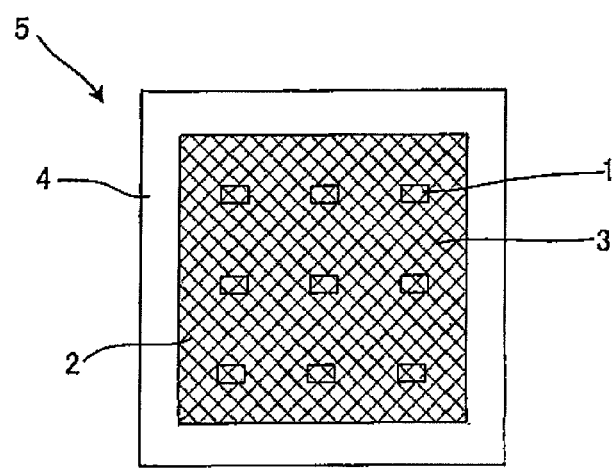
FIG. 2 is a top view of one example of screen printing plates used in the method for producing a screen print according to the present invention.

FIG. 2 is a top view of one example of the screen printing plates used in the method for producing a screen print according to the present invention. As shown in FIG. 2, screen 3 constituting the screen printing plate 5 has a mask material 2 in which one or more openings 1 having a given opening shape are formed. The screen 3 is provided with a filmy supporting member (screen mesh) usually comprising a gauze or the like, and the mask material is disposed on at least one film surface of the screen mesh. The material constituting the screen mesh is not particularly limited, but materials of high strength and rigidity are preferred, and as suitable examples, mention may be made of ER wire material and ERH wire material (trademarks) which are screen meshes manufactured by Murakami Co., Ltd.

Examples of the materials constituting the mask material are resins and metals. Both the openings of the shape and the number corresponding to the desired print pattern are formed in the screen 3. For convenience, FIG. 2 shows the state where nine openings 1 having a shape of rectangle are formed. The screen printing plate 5 comprises a printing plate frame 4 on which screen 3 is stretched, and the printing plate frame 4 is generally formed of a material having flexibility.

Figure 4:
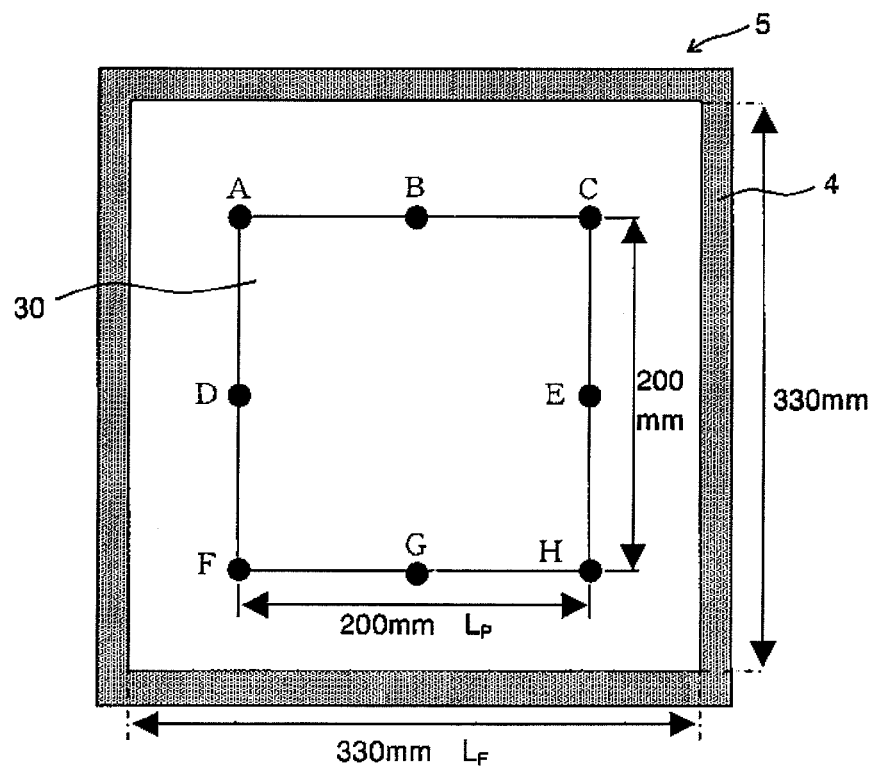
FIG. 4 is a schematic view showing the points at which the degree of deviation in printing position is measured.

As shown in FIG. 4, when an internal size of a side of the printing plate frame perpendicular to axis of the sliding direction of a squeegee (internal size of the printing plate frame) is indicated by [$L_F$], and a length of a side of the print pattern 30 perpendicular to the axis of the sliding direction of the squeegee (length of one side of print pattern 30) is indicated by [$L_P$], the value of $L_P/L_F$ must be 0.45 or more, preferably 0.5 or more, further preferably 0.52 or more, especially preferably 0.55 or more. When the value of $L_P/L_F$ is 0.45 or more, there can be produced a screen print excellent in printing precision. In many cases, the general screen printing is carried out at a value of $L_P/L_F$ of about 0.3. However, in the case of utilizing the clearance between printing material and screen as a parameter for enhancing the printing precision, if the value of $L_P/L_F$ is less than 0.45, conspicuous effect is not exhibited. Therefore, in the method for producing a screen print of the present invention, the clearance is effectively utilized as a parameter for improving printing precision by employing a value of $L_P/L_F$ of 0.45 or more.

As shown in FIG. 1, inside (or lower part) of the printing plate frame holder 11, a printing material 10 in the form of a flat plate is placed on a printing stage 12 in parallel to the surface of the printing plate frame holder 11. Examples of the printing material 10 include those which have been used in conventional screen printing. Suitable printing materials are fired ceramics substrates, ceramics green sheets, resin substrates, glass substrates, metallic substrates, etc.

In the method for producing a screen print according to this embodiment, the screen printing plate 5 is placed on the printing plate frame holder 11 in such a manner that the printing material 10 (printing surface of the printing material) and the screen 3 are in parallel to each other. In this case, the screen printing plate 5 is placed keeping a given clearance CL between the printing material 10 and the screen 3. It is necessary that the clearance CL is within the range of 0.1-2 mm, preferably 0.3-1.5 mm, especially preferably 0.4-1.5 mm, especially preferably 0.5-1.3 mm. By keeping the clearance CL in the range of 0.1-2 mm, there is obtained an advantage that the printing precision hardly decreases even when the printing is repeatedly carried out. If the clearance CL is less than 0.1 mm, defects such as blurring may sometimes occur when the print pattern is formed. On the other hand, if the clearance CL exceeds 2 mm, elongation of screen 3 caused by sliding of the squeegee is too much, and accordingly, printing of high precision cannot be repeatedly performed.

Hitherto, in order to improve positional precision of print patterns formed by screen printing, there have been attempted mainly to devise and improve screen printing plates such as employment of lithography using either a glass mask or increasing the rigidity of meshes. On the other hand, the adjustment of the clearance between printing material and screen has been considered to be a factor to control the shape of print patterns that are to be formed.

On the other hand, according to the present invention, it has been found that the clearance within a given numerical range and the degree of deviation in printing position of print pattern (degree of deviation from the desired design value) have a correlation, and by utilizing the correlation, an optimum clearance at which the degree of deviation in printing position that is smallest is selected, a printing material and a screen are disposed while keeping the selected optimum clearance, and the screen printing is carried out. That is, the method for producing a screen print according to the present invention is a method which reduces the deviation in the printing position of the print pattern by adjusting the clearance between the printing material and the screen which has not been noticed as a means for improving the positional precision of the print pattern, and thus, according to the present invention it becomes possible to produce a screen print excellent in printing precision. The method for producing a screen print of the present invention will be explained in more detail attaching an importance to the method of selecting and setting the optimum clearance.

As for specific methods for selecting and setting the optimum clearance in the present invention, mention may be made of a preferable method according to the following steps (1)-(5) (the first selecting and setting method) and a method according to the following steps (1a)-(3a) (the second selecting and setting method).

(The First Selecting and Setting Method)

(1) Test printing is carried out with setting the clearance at values of optional two or more points in the range of 0.1-2 mm to obtain an initial trial print (step (1)). Then, (2) the degree of deviation in the printing position of the initial trial print is measured, and a calibration curve is prepared by plotting the measured degree of deviation in the printing position against the clearance set above (step (2)).

Figure 5:
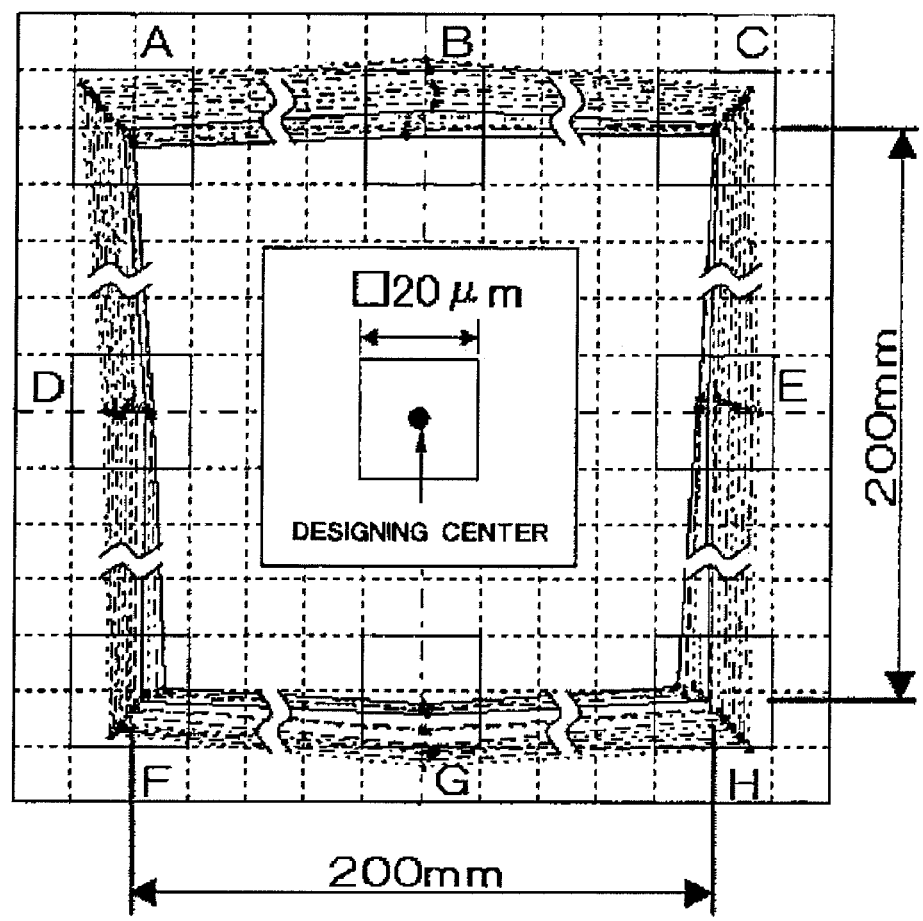
FIG. 5 is a graph prepared by plotting the results of the measurement of the deviation in the printing position of the initial trial print according to the first selecting and setting method.
Figure 6:
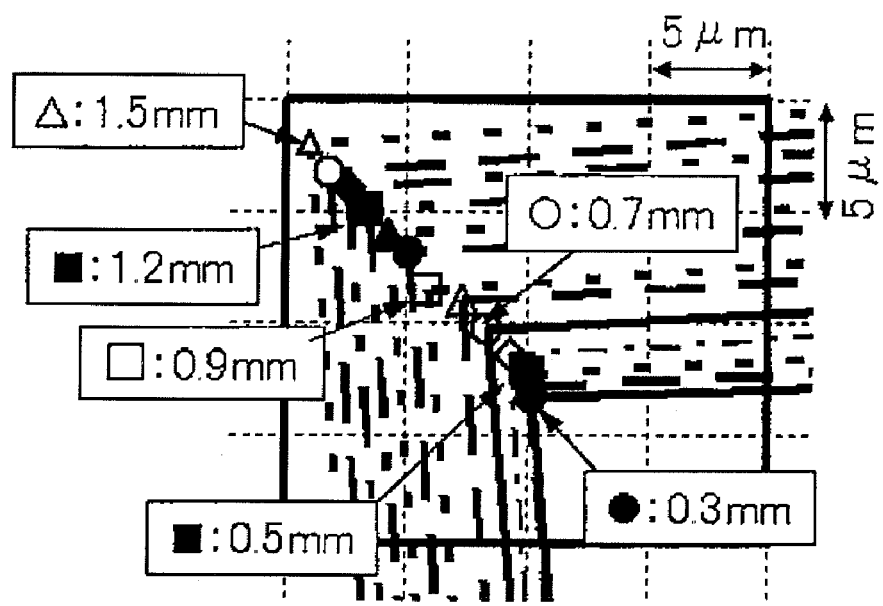
FIG. 6 is an enlarged view of portion A in FIG. 5.
Figure 7:
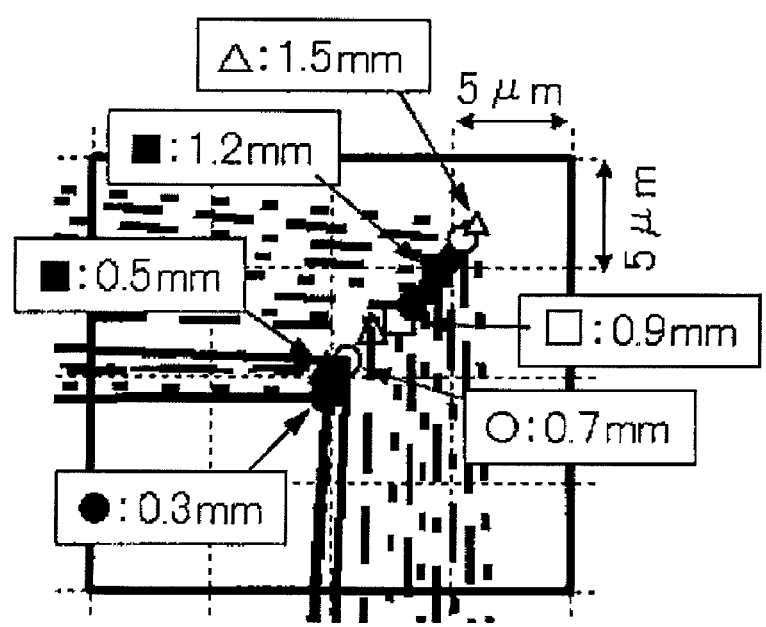
FIG. 7 is an enlarged view of portion C in FIG. 5.

FIG. 5 is a graph prepared by plotting the results of measurement of the degree of deviation in printing position of the initial trial print according to the first selecting and setting method. FIG. 6 is an enlarged view of portion A in FIG. 5, and FIG. 7 is an enlarged view of portion C in FIG. 5. FIG. 4 schematically shows the points at which the positional precision of the print pattern is measured. In FIG. 5-FIG. 7, the clearance is set at every 0.1 mm in the range of 0.3-1.5 mm, and the test printing is conducted at the respective clearances. The number of the clearance points set at step (1) may be 2 or more, and to obtain a higher correlation with the degree of deviation in printing position, it is preferred to set the clearances of 3 points or more, and it is even more preferred to set the clearances of 4-5 points. However, setting of clearances of 8 points or more is not preferred because the procedure becomes complicated.

Figure 8:
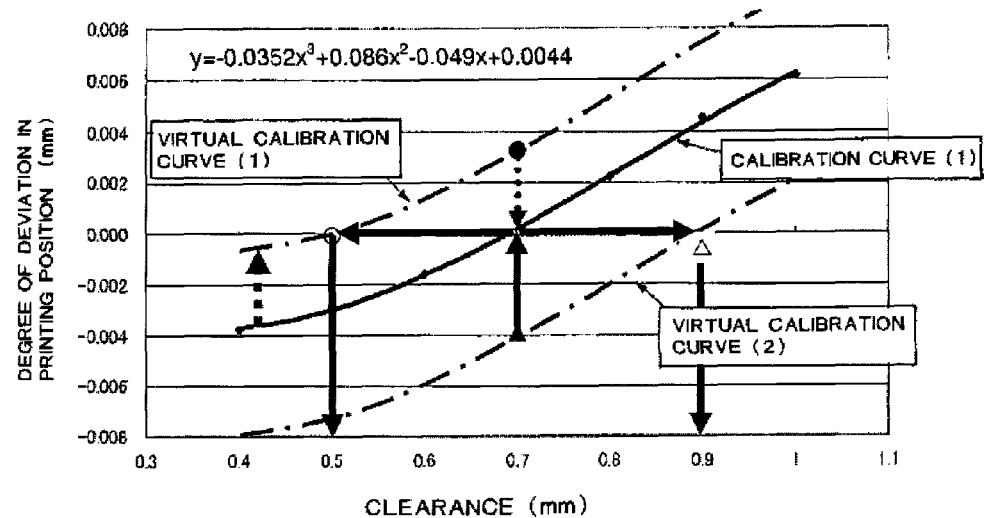
FIG. 8 is a graph showing one example of plotting a calibration curve and a virtual calibration curve.
Figure 9:
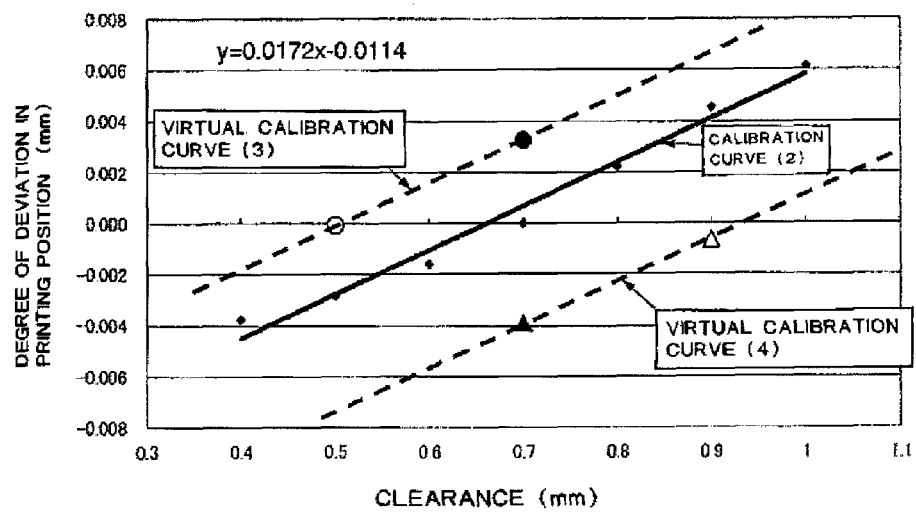
FIG. 9 is a graph showing another example of plotting a calibration curve and a virtual calibration curve.

In step (2), as shown in FIG. 8 and FIG. 9, calibration curves are prepared by plotting the measured degree of deviation in the printing position (mm) against the respective clearances (mm) set above. The calibration curves may be prepared by the least-squares method for n-order based on the plotted points. FIG. 8 shows the calibration curve (1) in the case of approximating the cubic function. On the other hand, FIG. 9 shows calibration curve (2) in the case of approximating the linear function.

Next, in step (3) test printing is carried out by setting the clearance at values of the optional one or more points in the range of 0.1-2 mm to obtain a subsequent trial print (step (3)). In step (3), a screen printing plate which is used which is the same as the screen printing plate used in the design specification step (2), but different individually from the screen printing plate used in step (2) (different individual plates). In many cases, the screen printing plates according to the same design specification show different degrees of deviation in printing position respectively even when the clearance is the same because of individual differences. However, since the design specification is the same, it can be assumed that the correlation between the clearance and the degree of deviation in printing position are close to each other even in the case of different individual plates.

The number of clearance points set at step (3) may be 1 point or more. However, the setting of clearances of 3 points or more is not preferred because the procedure becomes complicated.

Thereafter, in step (4) the degree of deviation in printing position of the subsequent trial print is measured, and the measured degree of deviation in the printing position is plotted against the clearance set above, and then the calibration curve is offset to obtain a virtual calibration curve which passes the plotted points (step (4)). As shown in FIG. 8, in step (4), the measured degree of deviation in the printing position (mm) is plotted against the set clearance (mm). In FIG. 8, it is shown that two trial prints of the second trail are produced using two screen printing plates while setting the clearance to 0.7 mm.

Then, the calibration curve (1) prepared at step (2) is offset in the direction of Y-axis to prepare virtual calibration curves (1) and (2) which pass the plotted points (black circle (●) and black triangle (▲) in FIG. 8). The calibration curve can be offset in the directions of X-axis (clearance) and/or Y-axis (degree of deviation in printing position). FIG. 9 shows an example in which the calibration curve (2) expressed by linear function is offset in the direction of Y-axis to prepare a virtual calibration curves (3) and (4) which pass the plotted points (black circle (●) and black triangle (▲) in FIG. 9).

Then, in step (5) the optimum clearance at which the degree of deviation in the printing position of the print pattern is the smallest is selected and set from the virtual calibration curve (step (5)). As shown in FIG. 8, in step (5), a point of intersection of degree of the deviation in printing position=0 (mm) and the virtual calibration curve (1) and a point of intersection of the degree of deviation in printing position=0 (mm) and the virtual calibration curve (2), with the optimum clearances (about 0.5 mm and about 0.9 mm) for the respective screen printing plates being read. Thereafter, the clearance between the printing material and the screen is set at the optimum clearance read above, and the screen printing is conducted in this state.

(The Second Selecting and Setting Method)

(1a) Test printing is carried out with setting the clearance at values of an optional two or more points in the range of 0.1-2 mm to obtain a trial print (step (1a)). Then, in step (2a) the degree of deviation in the printing position of the trial print in step (1a) is measured, and a calibration curve is prepared by plotting the measured degree of deviation in printing position against the clearance set above (step (2a)). The number of the points of clearance set at step (6) may be 2 points or more, and for obtaining a higher correlation with the degree of deviation in printing position, it is preferred to set clearances of 3 points or more, and it is even more preferred to set clearances of 4-5 points. However, setting of clearances of 8 points or more is not preferred because the procedure becomes complicated.

Figure 13:
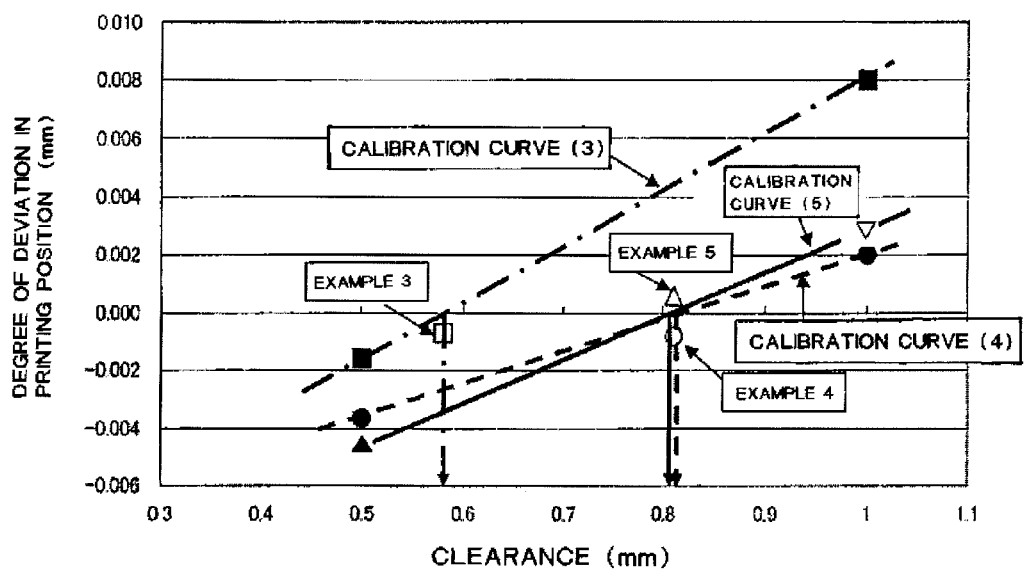
FIG. 13 is a graph showing one example of plotting a calibration curve according to the second selecting and setting method.

In step (2a), as shown in FIG. 13, the calibration curves are prepared by plotting the measured degree of deviation in the printing position (mm) against the respective clearances (mm) set above. In FIG. 13, the clearance is set at 0.5 mm and 1.0 mm, and the test printing is carried out using three kinds of screen printing plates at the respective clearances to prepare calibration curves (3), (4) and (5). The calibration curves may be prepared by the least-squares method for n-order based on the plotted points. FIG. 13 shows calibration curves (3), (4) and (5) in the case of approximating the linear function.

Then, in step (3a) the optimum clearance at which the degree of deviation in the printing position of the print pattern is the smallest is selected from the calibration curve and is set (step (3a)). As shown in FIG. 13 in step (3a), from the intersection point of degree of deviation in the printing position=0 (mm) and the virtual calibration curve (3), the intersection point of the degree of deviation in the printing position=0 (mm) and the virtual calibration curve (4), and the intersection point of the degree of deviation in the printing position=0 (mm) and the virtual calibration curve (5), the optimum clearances (about 0.58 mm, about 0.81 and about 0.82 mm) for the respective screen printing plates are read. Thereafter, the clearance between the printing material and the screen is set at the optimum clearance read above, and the screen printing is conducted in this state using the screen printing plates for which the respective calibration curves are prepared.

As mentioned above, selecting and setting of the optimum clearance by the first selecting and setting method is particularly effective when the screen printing plate used for preparation of the calibration curve and the screen printing plate used for actual printing are of the same design specification (lot), but are different individual plates. On the other hand, selecting and setting of the optimum clearance by the second selecting and setting method can also be conducted on the condition that the screen printing plate used for preparation of calibration curve and the screen printing plate used for actual printing are the same individual plates.

Specifically, the screen printing can be carried out in the following manner. That is, a given ink, paste or the like is put on screen 3 (cf. FIG. 1). Then, a squeegee or the like is slid over the screen 3 to squeeze out the paste from the openings, thereby obtaining a screen print comprising the printing material 10 on the printing surface of which is formed a print pattern corresponding to the shape of the opening or corresponding to the arranged pattern of a plurality of the openings that are formed. When the printing is repeatedly carried out on the same printing surface, the printing patterns can be laminated.

According to the method for producing a screen print of the present invention, use of a parameter as a clearance between a printing material and a screen which has a very high correlation with the degree of deviation in the printing position of the print pattern, the printing can be carried out by selecting an optimum clearance, and hence a printing of very high precision can be obtained. Therefore, a screen print can be produced simply on which a given print pattern of high precision is formed. Furthermore, since a general screen printing plate and a general screen printing machine can be used without any special reconstruction, the method is high in general versatility and a reduction in printing costs can be attained.

In the case of carrying out the screen printing on an LTCC substrate (printing material) of 200 mm×200 mm (□200 mm, 40000 mm$^2$) in the area of printing surface, the print pattern is usually required to have a positional precision of about 5 μm in view of the constraints of the deviation caused by lamination of LTCC substrates. The method for producing a screen print of the present invention is particularly effective when the size (internal size) of printing plate frame (screen) is large, namely, 300 mm×300 mm (□300 mm, 90000 mm$^2$)-400 mm×400 mm (□400 mm, 160000 mm$^2$). With reference to the size of print pattern, the method is particularly effective when it is a large size of 150 mm×150 mm (□150 mm, 22500 mm$^2$) or more, and the size is more preferably 180 mm×180 mm (□180 mm, 32400 mm$^2$) or more.

As the screen prints obtained by the method for producing a screen print of the present invention, mention may be made of those which have circuits comprising at least dielectrics or conductors that have patterns having passive elements or active elements by virtue of the characteristics that a print screen having a highly precise print pattern may be easily produced. The passive elements include capacitor elements, etc. and the active elements include electro-mechanical transducers, etc.

When the printing material is a ceramics green sheet, the screen print is preferably a constituent of laminated substrate obtained by laminating a plurality of the screen prints. Specific examples of the laminated substrate are LTCC substrate, ceramic capacitor, laminate type piezoelectric actuator, NO$_x$.oxygen sensor, etc. That is, according to the method for producing a screen print of the present invention, since prints having high precision printing patterns can be produced, when a plurality of the prints are laminated, LTCC substrates having little deviation in print precision from each other caused by lamination can be easily produced. Furthermore, when the resulting LTCC substrates are fired, high performance circuit substrates on which circuits are very precisely disposed can be produced.

EXAMPLES

The present invention will be specifically explained by the following examples, which should not be construed as limiting the invention.

Example 1

Using a screen printing plate 5 of 330 mm×330 mm in internal size as shown in FIG. 4 (manufactured by Murakami Co., Ltd., the size of the print pattern to be formed: 200 mm×200 mm), with a clearance set at every 0.1 mm within the range of 0.3-1.5 mm, with the test printing was conducted with the respective clearances to produce thirteen trial prints according to the first selecting and setting method. The degree of deviation in the printing position of the resulting first trial prints (the degree of deviation from the designing center) was measured. FIGS. 5-7 show graphs prepared by plotting the results of the measurements. The degree of deviation in the printing position (mm) was plotted against the respective clearances (mm) set above to prepare the calibration curves shown in FIG. 8. FIG. 8 shows calibration curve (1) in the case of approximating in the cubic function ($y=-0.0352x^3+0.086x^2-0.049x+0.0044$).

Figure 10:
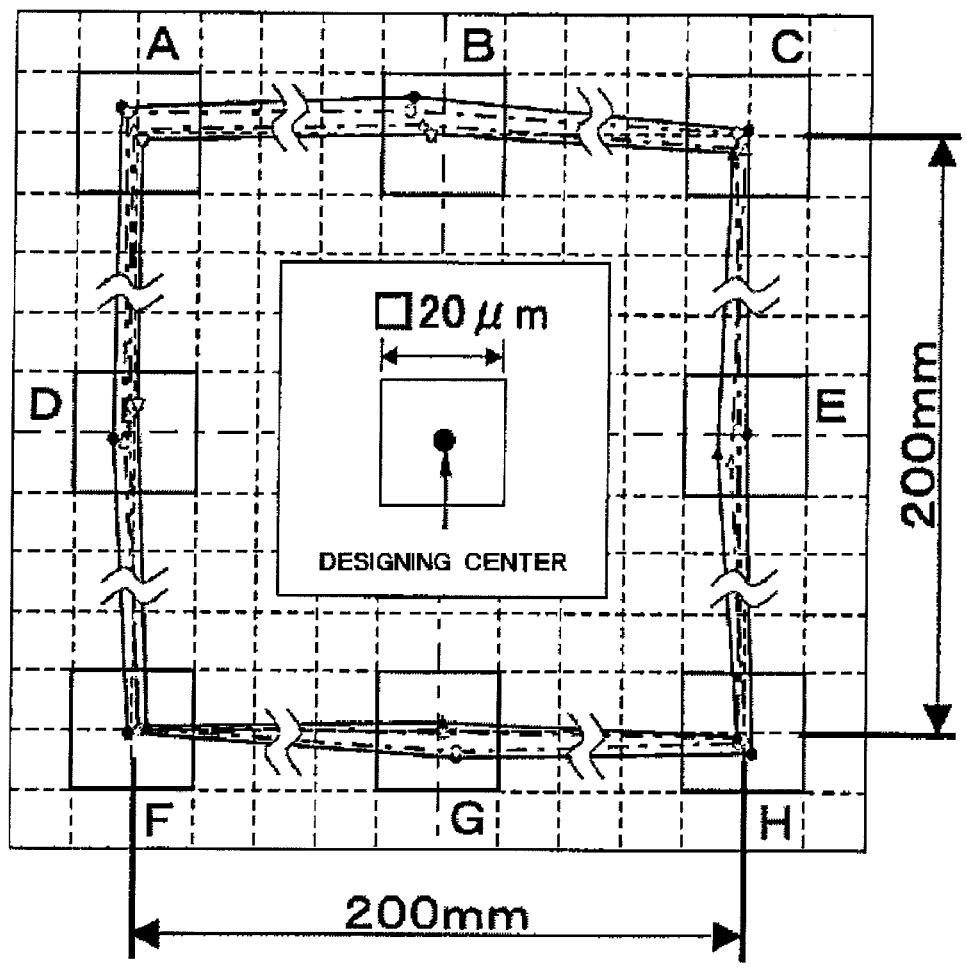
FIG. 10 is a graph obtained by plotting the results of measurement of degree of deviation in printing position of the screen print.
Figure 11:
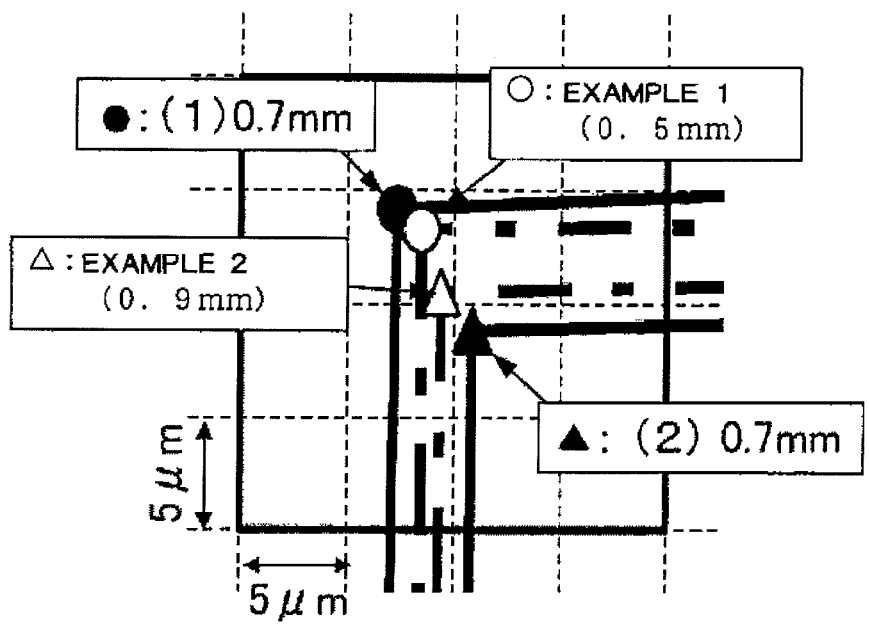
FIG. 11 is an enlarged view of portion A in FIG. 10.
Figure 12:
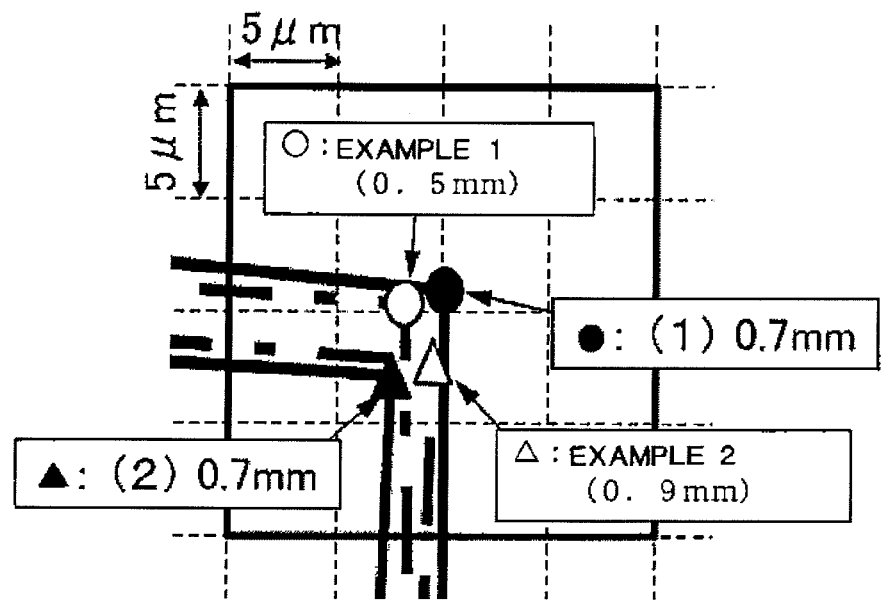
FIG. 12 is an enlarged view of portion C in FIG. 10.

Using a screen printing plate which was the same in design specification (lot) as the screen printing plate was used hereinbefore, but different in individual from the screen printing plate used hereinbefore, the test printing was then conducted in the state of setting the clearance at 0.7 mm to produce a second trial print. The degree of deviation in the printing position of the resulting second trial print was measured. FIGS. 10-12 show graphs prepared by plotting the results of the measurements. In FIGS. 10-12, the plotted point is shown by black circle (●). The measured deviation in the printing position (mm) was plotted against the set clearance (0.7 mm), and the calibration curve prepared hereinbefore was offset in the direction of Y-axis (the degree of deviation in the printing position) to prepare a virtual calibration curve which passed the plotted points. The prepared virtual calibration curve (1) is shown in FIG. 8. From the intersection point of the degree of deviation in the printing position =0 (mm) and the virtual calibration curve (1), when an optimum clearance (about 0.5 mm) for the screen printing plate used for producing the second trial print was read, and screen printing was carried out with the clearance set between the printing material and the screen at 0.5 mm to produce a screen print. The degree of deviation in printing position of the resulting screen print was measured, and graphs prepared by plotting the results of the measurements are shown in FIGS. 10-12.

Example 2

Screen prints were produced in the same manner as in Example 1, except that screen printing plates of different lots were used. FIGS. 10-12 show graphs prepared by plotting the results of the measurements of the degree of deviation in the printing position of the resulting screen prints. In FIGS. 10-12, the point of plotting the results of the measurements of the degree of deviation in the printing position of the second trial print is shown by a black triangle.

Example 3

Using a screen printing plate 5 of 330 mm×330 mm in internal size as shown in FIG. 4 (manufactured by Murakami Co., Ltd., with a size of print pattern to be formed: 200 mm×200 mm), the clearance was set at 0.5 mm and 1.0 mm, and the test printing was conducted with the respective clearances to produce two trial prints according to the second selecting and setting method, and the degree of deviation in the printing position was measured. The degree of deviation in the printing position (mm) was then plotted against the respective clearances (mm) set above to prepare calibration curve (3) shown in FIG. 13.

From the intersection point of the degree of deviation in the printing position=0 (mm) and the calibration curve (3), with the optimum clearance (about 0.58 mm) for the screen printing plate used for producing the trial print according to the second selecting and setting method was read, and the screen printing was carried out using the screen printing plate used hereinbefore as it was set with the clearance between the printing material and the screen at about 0.58 mm to produce a screen print. The degree of deviation in the printing position of the resulting screen print was measured, and a graph prepared by plotting the results of the measurements as shown in FIG. 13.

Examples 4 and 5

Screen prints were produced in the same manner as in Example 3, except that the screen printing plates used were from different lots. FIG. 13 shows the calibration curves (4) and (5) prepared in producing the respective screen prints, and the graphs prepared by plotting the results of the measurements of the degree of deviation in the printing position of the resulting screen prints.

As shown in FIGS. 10-13, it is clear that according to the method for producing a screen print of Examples 1-5, screen prints on which the print patterns small in degree of deviation from the designing center and high in positional precision are formed and thus can be produced by selecting and setting the optimum clearances.

INDUSTRIAL APPLICABILITY

The method for producing a screen print according to the present invention is suitable as a method for producing various electronic parts since the method can form fine patterns, is high in general versatility, and is suitable for mass-production. Furthermore, according to the method of the present invention, the degree of positional deviation of screen prints can be controlled to a certain range of permissible tolerances. Therefore, the method of the present invention exhibits particularly conspicuous effects in producing laminated electronic parts by laminating a plurality of screen prints.

The invention claimed is:

1. A method for producing a screen print having a given print pattern formed thereon by sliding a squeegee in a given direction over a screen of a screen printing plate comprising the screen having a mask material with openings and a printing plate frame on which the screen is stretched, said screen being disposed above a printing material in the form of a flat plate in parallel with the printing material with keeping a given clearance therebetween, wherein a ratio ($L_P/L_F$) of a length ($L_P$) of a side of the print pattern perpendicular to an axis of the sliding direction of the squeegee to an internal size ($L_F$) of a side of the printing plate frame perpendicular to the axis of the sliding direction of the squeegee is 0.45 or more, and;

wherein an optimum clearance between the printing material and the screen is selected and set on the basis of correlation between the clearance in the range of 0.1-2 mm and the degree of deviation in printing position of the print pattern.

2. A method for producing a screen print according to claim 1, wherein the optimum clearance is selected and set according to the following procedures (1)-(5):

(1) a test printing is carried out with setting the clearance at values of optional two or more points in the range of 0.1-2 mm to obtain an initial trial print, (2) the degree of deviation in printing position of the initial trial print is measured, and a calibration curve is obtained by plotting the degree of deviation in printing position against the clearance set above, (3) a test printing is carried out with setting the clearance at value of optional one or more points in the range of 0.1-2 mm to obtain a subsequent trial print, (4) the degree of deviation in printing position of the subsequent trial print is measured, the degree of deviation in printing position is plotted against the clearance set above, and then the calibration curve is offset to obtain a virtual calibration curve which passes the plotted points, and (5) the optimum clearance at which the degree of deviation in printing position of the print pattern is the smallest is selected and set from the virtual calibration curve.

3. A method for producing a screen print according to claim 2, wherein the clearance is 0.3-1.5 mm.

4. A method for producing a screen print according to claim 2, wherein the printing material is a fired ceramics substrate or a ceramics green sheet.

5. A method for producing a screen print according to claim 2, wherein the screen print is a constituent of a laminated substrate obtained by laminating a plurality of the prints.

6. A method for producing a screen print according to claim 1, wherein the optimum clearance is selected and set according to the following procedures (1a)-(3a):

(1a) a test printing is carried out with setting the clearance at values of optional two or more points in the range of 0.1-2 mm to obtain a trial print, (2a) the degree of deviation in printing position of the trial print is measured, and a calibration curve is obtained by plotting the measured degree of deviation in printing position against the clearance set above, and (3a) the optimum clearance at which the degree of deviation in printing position of the print pattern is the smallest is selected and set from the calibration curve.

7. A method for producing a screen print according to claim 6, wherein the clearance is 0.3-1.5 mm.

8. A method for producing a screen print according to claim 6, wherein the printing material is a fired ceramics substrate or a ceramics green sheet.

9. A method for producing a screen print according to claim 6, wherein the screen print is a constituent of a laminated substrate obtained by laminating a plurality of the prints.

10. A method for producing a screen print according to claim 1, wherein the clearance is 0.3-1.5 mm.

11. A method for producing a screen print according to claim 1, wherein the printing material is a fired ceramics substrate or a ceramics green sheet.

12. A method for producing a screen print according to claim 1, wherein the screen print is a constituent of a laminated substrate obtained by laminating a plurality of the prints.

* * * * *